(12) United States Patent
Consolini et al.

(10) Patent No.: US 7,531,040 B2
(45) Date of Patent: May 12, 2009

(54) RESIST RECOVERY METHOD

(75) Inventors: Joseph Consolini, Costa Mesa, CA (US); Keith Best, Prunedale, CA (US); Cheng Gui, Best (NL); Alexander Friz, San Jose, CA (US)

(73) Assignee: ASML Holdings N.V., Veldhoven (NL)

( * ) Notice: Subject to any disclaimer, the term of this patent is extended or adjusted under 35 U.S.C. 154(b) by 0 days.

(21) Appl. No.: 10/678,899

(22) Filed: Oct. 2, 2003

(65) Prior Publication Data

US 2005/0072733 A1    Apr. 7, 2005

(51) Int. Cl.
*B05C 11/02*     (2006.01)
(52) U.S. Cl. .......................................... 118/52; 118/603
(58) Field of Classification Search .................... 118/52, 118/56, 319, 320, 501, 603, 610; 134/902
See application file for complete search history.

(56) References Cited

U.S. PATENT DOCUMENTS

| | | | | |
|---|---|---|---|---|
| 5,711,809 A | * | 1/1998 | Kimura et al. | 118/663 |
| 5,997,653 A | * | 12/1999 | Yamasaka | 134/2 |
| 6,572,701 B2 | * | 6/2003 | Yamauchi et al. | 118/52 |
| 6,589,338 B1 | * | 7/2003 | Nakamori et al. | 118/50 |
| 6,713,122 B1 | * | 3/2004 | Mayer et al. | 216/13 |
| 6,740,163 B1 | * | 5/2004 | Curtiss et al. | 118/423 |
| 6,807,972 B2 | * | 10/2004 | Chiu et al. | 134/94.1 |
| 2002/0112662 A1 | * | 8/2002 | Yamauchi et al. | 118/52 |

* cited by examiner

*Primary Examiner*—Brenda A Lamb
(74) *Attorney, Agent, or Firm*—Sterne, Kessler, Goldstein & Fox P.L.L.C.

(57) ABSTRACT

A method is disclosed for one embodiment. An amount of photoresist is deposited upon a substrate, the amount of photoresist more than necessary to coat the substrate. The substrate is spun within a bowl such that an excess amount of photoresist is propelled off of the substrate to an interior surface of the bowl. A portion of the excess amount of photoresist is recovered and treated such that the recovered portion of the excess amount of photoresist is rendered usable.

14 Claims, 5 Drawing Sheets

RESIST RECOVERY METHOD

FIELD

Embodiments of the invention relate generally to the field of semiconductor manufacturing and more particularly to photolithography and to methods and apparatuses for the reduction of photoresist consumption.

BACKGROUND

The manufacture of semiconductor devices typically includes a photolithographic process. Photolithography typically involves various combinations of material deposition, etching, and chemical treatment.

A portion of a typical lithography process would proceed as follows. A film (e.g., a metal film) layer is deposited on a substrate. The film layer is typically only a few nanometers (nm) thick. A photoresist layer is then deposited on the substrate (i.e., over the film layer). A photoresist is a photosensitive material that hardens when exposed to light. The positive or negative photoresist may typically be spun on to the substrate and may include solvents to ensure a uniform coating. Such photoresists may be soft baked after deposition to drive off excess solvents. The photoresist is then selectively hardened by exposure to light in specific places. Typically a mask (i.e., a transparent plate having a printed pattern) and a light source (scanner or stepper) are used to illuminate the specified portions of the photoresist layer. Then, the non-exposed portion of the photoresist layer (e.g. the non-hardened portion of the photoresist layer), is removed by the photoresist developer. The underlying portion of the film layer (i.e., metal, oxide, nitride, etc.) is etched using a chemical treatment (wet etch) or plasma (dry etch). Subsequently, the exposed portion of the photoresist layer, is developed leaving the patterned film layer, which can be used to etch the underlying material, or be used as a mold for plating or deposition of material to fill in the pattern to complete the image transfer from patterned photoresist to the patterned material needed for the actual device layer.

FIG. 1 illustrates a typical apparatus and method for applying photoresist to a wafer in accordance with the prior art. System 100, shown in FIG. 1, includes a wafer platform 105 on which a wafer 106 is placed. Photoresist is dispensed from photoresist nozzle 110 and applied to wafer 106. The wafer platform 105 and wafer 106 are then lowered into the chamber (bowl) 120, as indicated by arrow 121. The motor 130 then rotates the wafer spindle 131 to spin the wafer platform 105 and wafer 106. Spinning the wafer helps to dispense the photoresist across the wafer and level the photoresist. Upon initial spinning, a large proportion of the photoresist is spun off the wafer against the inner surface of the bowl. This excess photoresist proceeds down drainpipe 135 to receptacle 140 or may proceed to a waste drain.

A solvent is directed toward the edge of the wafer to effect edge-bead removal, which is the removal of photoresist from the edge of the wafer. This solvent is dispensed through edge-bead removal nozzle 145. The solvent, and any particulate matter from the edge-bead removal process, also proceeds down drainpipe 135 to receptacle 140.

To prevent excess photoresist from accumulating on the inner surface of the bowl, the bowl is rinsed with a solvent. Typically, the same type of solvent used for the edge-bead removal process may be used for the bowl wash. The solvent is dispensed along the inner surface of the bowl, through, for example, a weeping seal 150, as shown in FIG. 1. Again, the solvent from the bowl wash proceeds down drainpipe 135 to receptacle 140.

The excess photoresist in receptacle 140 is contaminated with solvents and particulate matter and cannot be reused for photolithography. This photoresist is expensive and adds significantly to the cost of semiconductor device manufacture. Moreover, there is a significant cost associated with disposal of the photoresist/solvent byproduct.

Previous efforts to address this situation have focused on reducing the amount of photoresist used. For example, over the past twenty years, increasingly accurate pumps to dispense the photoresist have been developed. Through the use of such accurate pumps, the amount of photoresist used has been reduced dramatically. Still, the photoresist that is used is used inefficiently, a large proportion of the photoresist is discarded, with the attendant costs and disadvantages.

SUMMARY

A method is disclosed for one embodiment. An amount of photoresist is deposited upon a substrate, the amount of photoresist more than necessary to coat the substrate. The substrate is spun within a bowl such that an excess amount of photoresist is propelled off of the substrate to an interior surface of the bowl. A portion of the excess amount of photoresist is recovered and treated such that the recovered portion of the excess amount of photoresist is rendered usable.

Other features and advantages of embodiments of the present invention will be apparent from the accompanying drawings, and from the detailed description, that follows below.

BRIEF DESCRIPTION OF THE DRAWINGS

The invention may be best understood by referring to the following description and accompanying drawings that are used to illustrate embodiments of the invention. In the drawings.

DETAILED DESCRIPTION

Embodiments of the invention provide methods and apparatuses for the recovery of photoresist. In various embodiments, the excess photoresist that is spun off the wafer is recovered and filtered for reuse. For such embodiments, the amount of photoresist necessary for semiconductor device production and the amount of resultant chemical waste that must be disposed of, is substantially reduced.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

Figure 2:
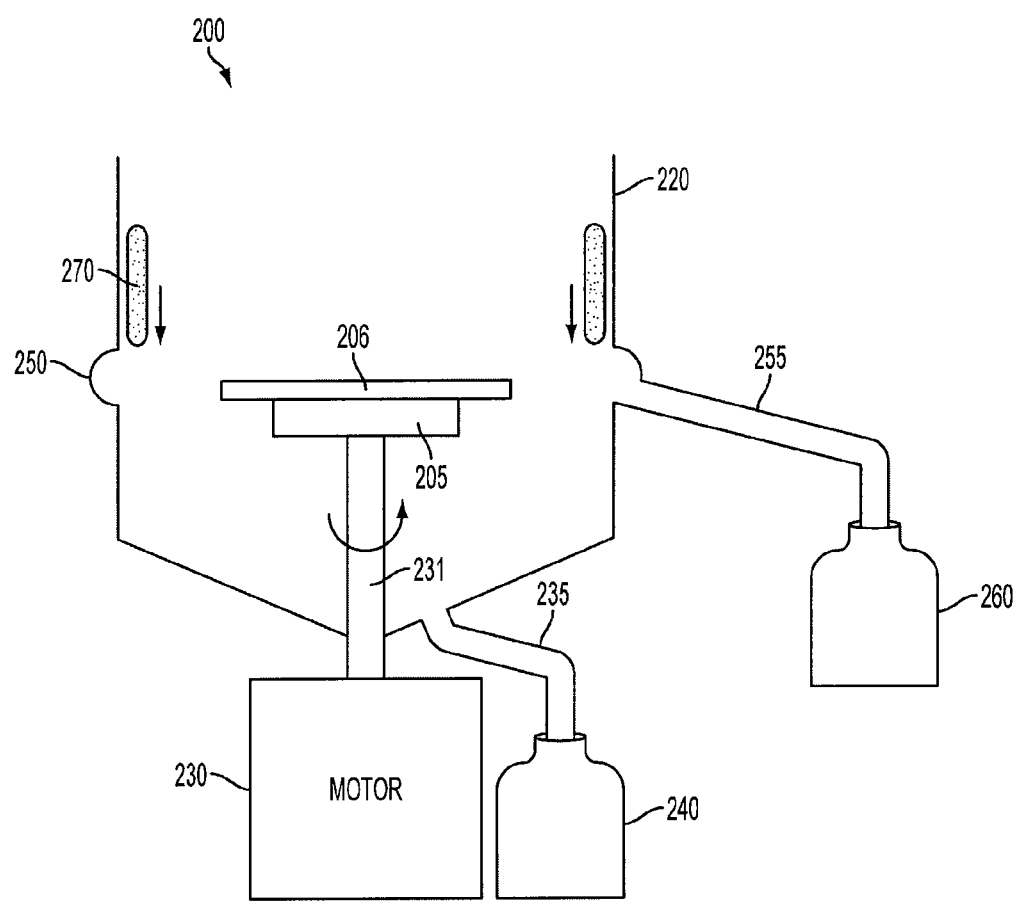
FIG. 2 illustrates an apparatus for photoresist recovery in accordance with one embodiment of the invention.

FIG. 2, illustrates an apparatus for photoresist recovery in accordance with one embodiment of the invention. System 200, shown in FIG. 2, includes a wafer 206 positioned on wafer platform 205. The wafer platform 205 and the wafer 206, having photoresist deposited thereon, have been lowered into bowl 220. The motor 230 then rotates the wafer spindle 231 to spin the wafer platform 205 and wafer 206. Upon initial spin, the excess photoresist is spun off toward the inner surface of the bowl 220. In accordance with one embodiment of the invention, bowl 220 has a perimeter drain 250 that extends along the perimeter of the bowl 220. For one embodiment the perimeter drain 250 is positioned level with the lowered wafer platform 205 and the rotating wafer 206. For alternative embodiments, the perimeter drain 250 is positioned below the lowered wafer platform 205 and the rotating wafer 206.

The excess photoresist, which may be up to approximately 90% of the photoresist deposited on the wafer, is spun off the wafer and into perimeter drain 250. From there, the excess photoresist proceeds down recovery drainpipe 255 to a photoresist recovery container 260. In an alternative embodiment, the bowl may separate to allow the excess photoresist recovery container.

Figure 1:
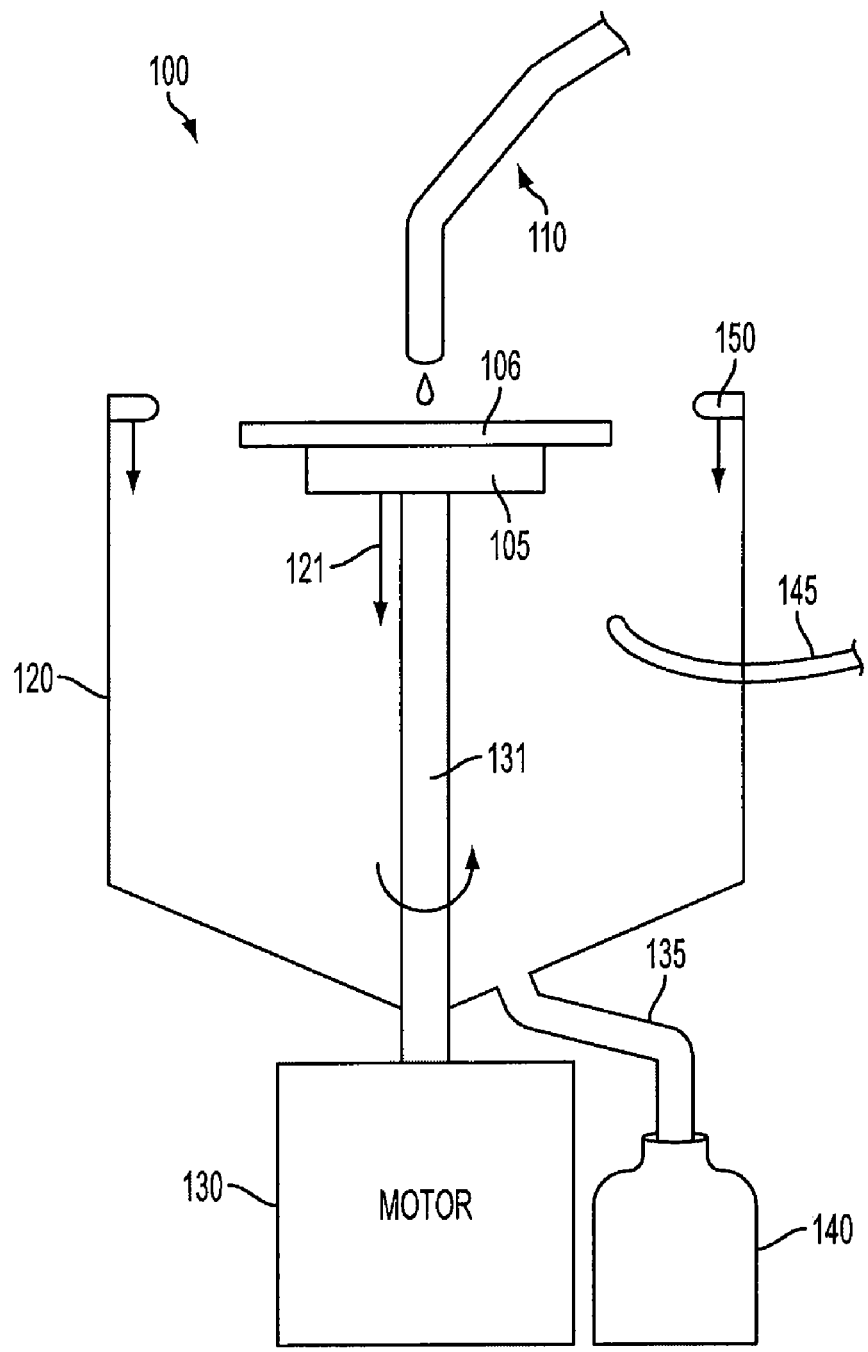
FIG. 1 illustrates a typical apparatus and method for applying photoresist to a wafer in accordance with the prior art.

For one embodiment, the system 200 also includes a perimeter drain block 270. After the excess photoresist is recovered, the perimeter drain block 270 is positioned in front of perimeter drain 250 and the edge-bead removal process and bowl wash process proceed as described above in reference to FIG. 1. The solvents and any particulate matter from the edge-bead removal process and bowl wash process proceed through drainpipe 235 to waste receptacle 240.

In various alternative embodiments, the position of the bowl 220 may be adjustable to effect photoresist recovery. Additionally, or alternatively, the position of wafer spindle 231 within bowl 220 is adjustable to align to perimeter drain 250.

Figure 3:
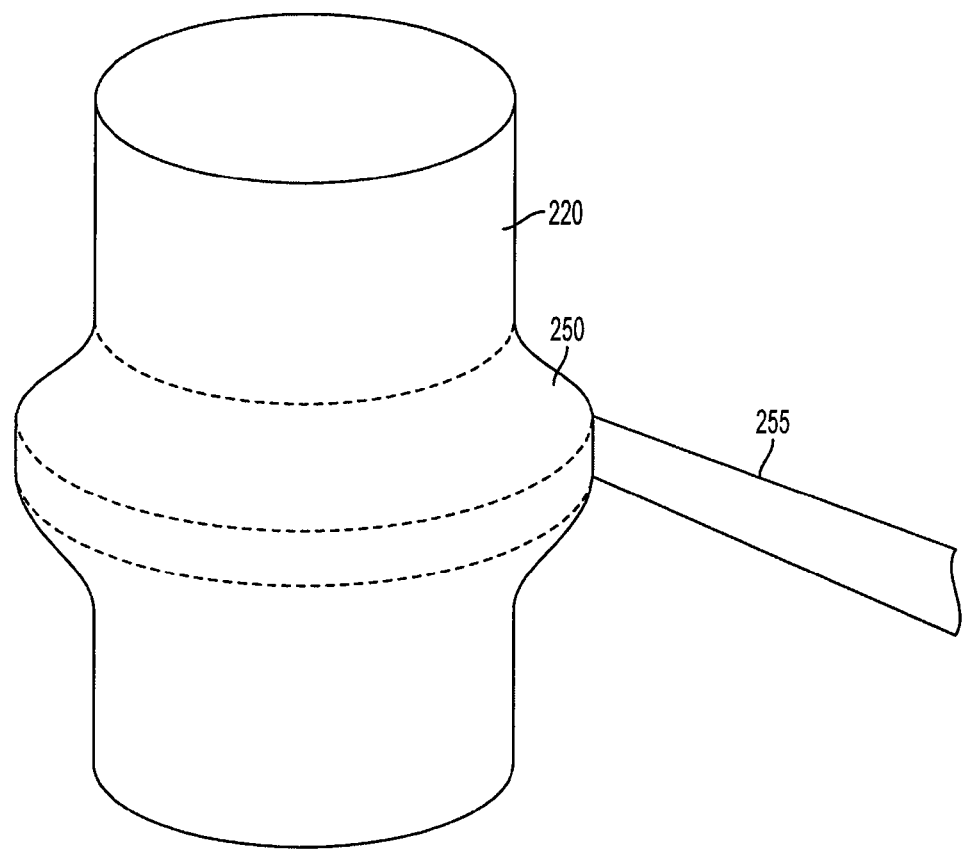
FIG. 3 illustrates the perimeter drain for use in one embodiment of the invention.

FIG. 3 illustrates the perimeter drain for use in one embodiment of the invention. FIG. 3 shows perimeter drain 250 extending around the perimeter of the bowl 220 and connecting the interior surface of the bowl to recovery drainpipe 255. For various alternative embodiments, the perimeter drain may be angled to facilitate movement of the photoresist toward the recovery drainpipe 255. Additionally, a solvent-rich environment may be maintained within the perimeter drain 250 and the recovery drainpipe 255. The solvent-rich environment, which may consist of solvent vapor, helps to prevent the photoresist from drying (hardening) in the recovery drainpipe. The solvent may be of the same type as used in the photoresist.

Figure 4:
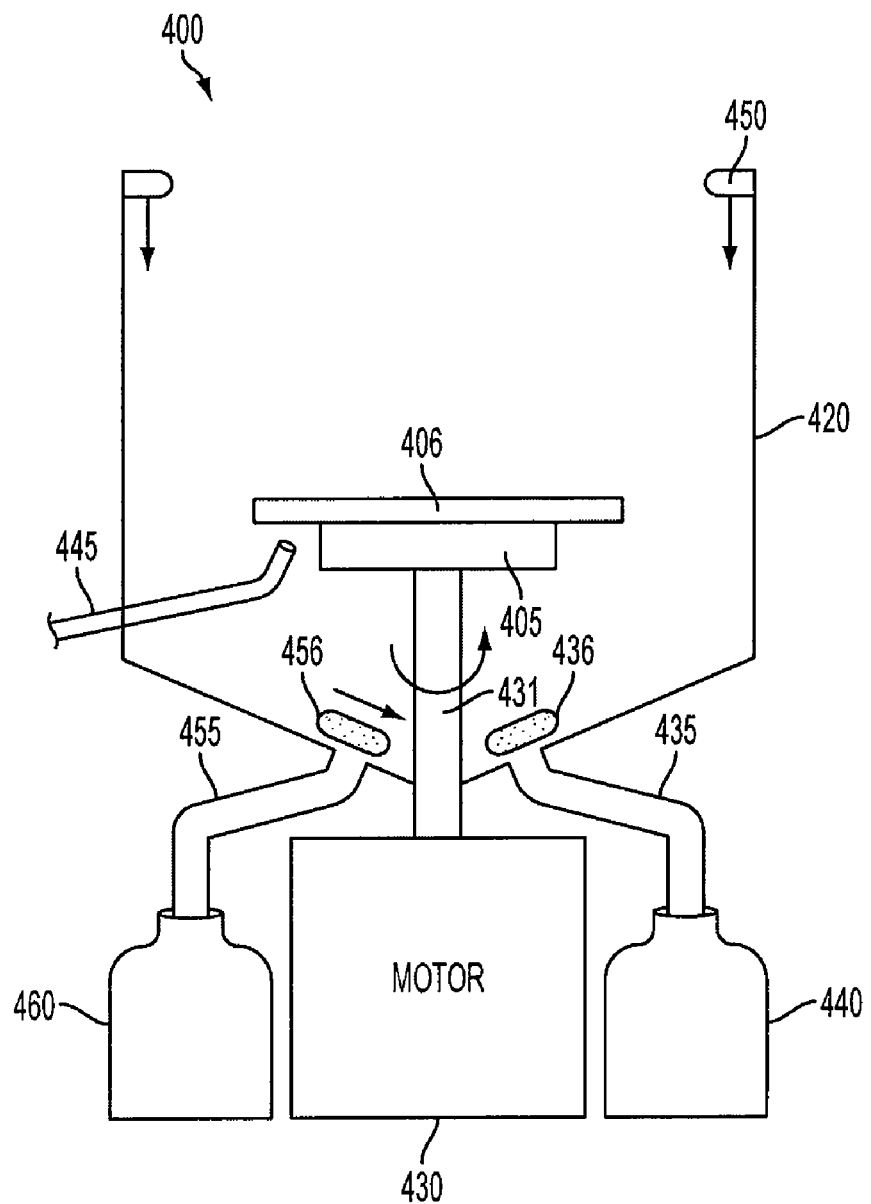
FIG. 4 illustrates an apparatus for photoresist recovery in accordance with one embodiment of the invention.

FIG. 4 illustrates an apparatus for photoresist recovery in accordance with one embodiment of the invention. System 400, shown in FIG. 4, includes a wafer 406 on top of wafer platform 405. The wafer 406 and the wafer platform have been lowered into bowl 420. The motor 430 then rotates the wafer spindle 431 to spin the wafer platform 405 and wafer 406. Excess photoresist is spun off the wafer against the inner surface of bowl 420. At this point a photoresist recovery bowl wash process is effected. The bowl wash uses the same or compatible solvent as is used in the photoresist. A weeping seal 450 dispenses the solvent along the inner surface of the bowl 420. The excess-photoresist/solvent composition proceeds down recovery drainpipe 455 to photoresist recovery container 460. During the photoresist recovery bowl wash, the waste drainpipe 435 is blocked by drainpipe block 436. This prevents the excess-photoresist/solvent composition from proceeding down waste drainpipe 435.

After the photoresist recovery bowl wash is completed and the excess-photoresist/solvent composition has proceeded down recovery drainpipe 455, the recovery drainpipe block 456 is positioned in front of the recovery drainpipe 455 and the drainpipe block 436 is removed from in front of waste drainpipe 435. The edge-bead removal process is then effected as described above in reference to FIG. 1. The solvent used in the edge-bead removal process is typically not the same as used in the photoresist. The solvent, and any particulate matter from the edge-bead removal process, proceeds down waste drainpipe 435 to waste receptacle 440. After the edge-bead removal process is complete, a final bowl wash is performed. The solvent used in the final bowl wash also proceeds down waste drainpipe 435 to waste receptacle 440.

Figure 5:
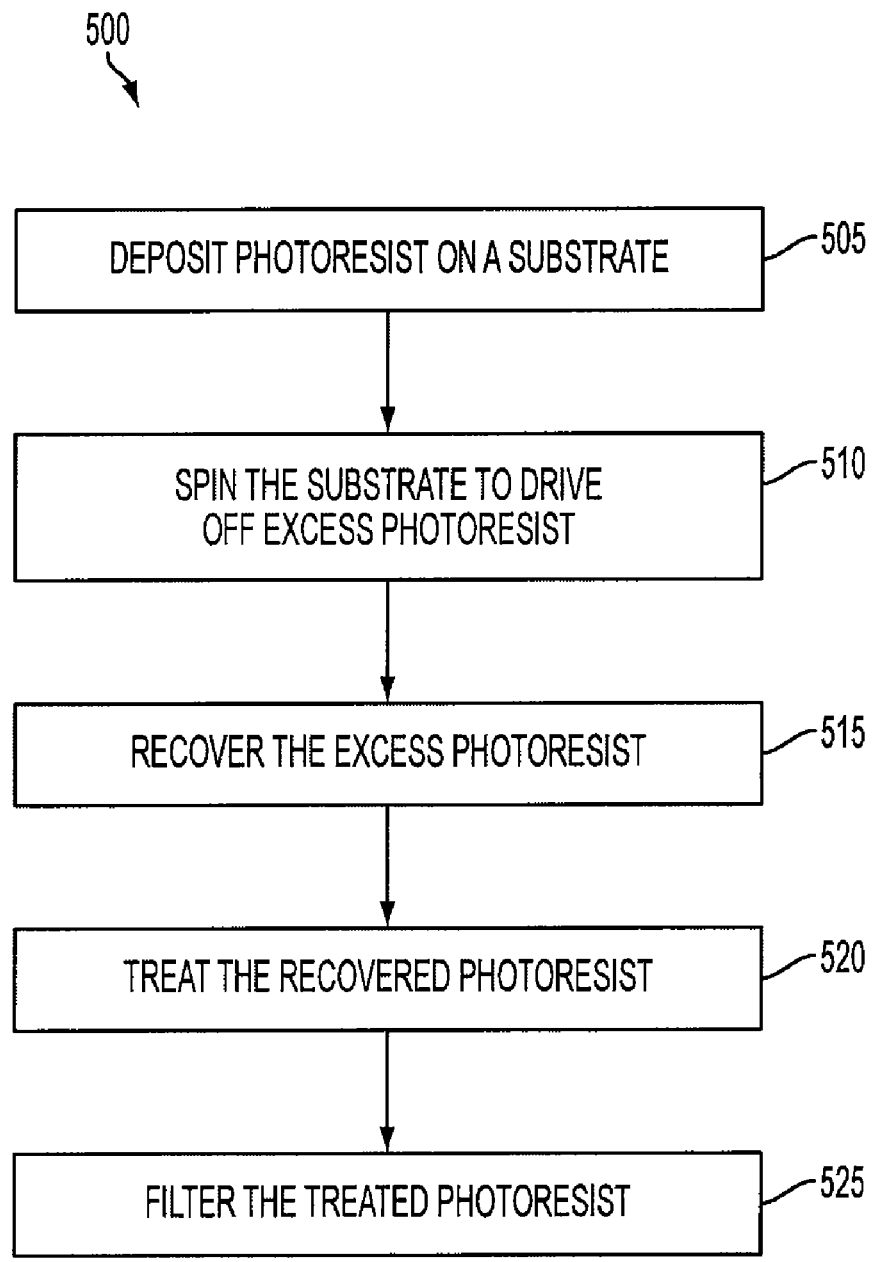
FIG. 5 illustrates a process for recovering photoresist in accordance with one embodiment of the invention.

FIG. 5 illustrates a process for recovering photoresist in accordance with one embodiment of the invention. Process 500, shown in FIG. 5, begins at operation 505 in which photoresist is deposited upon a substrate (e.g., a semiconductor wafer). The photoresist may contain solvent to assist in uniform coating of the wafer.

At operation 510 the wafer is spun to drive off (propel) excess photoresist from wafer. The wafer is spun within a chamber and the excess photoresist is directed toward the inner surface of the chamber.

At operation 515, the excess photoresist is recovered. For various embodiments of the invention, the excess photoresist may be recovered through use of systems such as system 200 or system 400, described above in reference to FIG. 2 and FIG. 4, respectively. In various embodiments of the invention, a solvent is added to the photoresist during the recovery process. For such embodiments, the solvent may be the same, similar to, or compatible with, the solvent originally contained in the photoresist to aid in uniform coating.

At operation 520, the recovered photoresist is treated to provide photoresist with the desired amount of solvent. For various embodiments, treatment may include adding solvent to the recovered photoresist. For example, where the photoresist is recovered using a system similar to system 200, as described in reference to FIG. 2, the recovered photoresist may have less than the desired amount of solvent. Even for an embodiment in which a solvent-rich environment is employed within the recovery drainpipe, the amount of solvent added by such a solvent rich environment is less than the amount of solvent removed from the photoresist by spinning the wafer.

For alternative embodiments that employ a photoresist recovery bowl wash process, the excess-photoresist/solvent composition captured in the photoresist recovery container has more than a desired amount of solvent. For such embodiments, treatment of the recovered photoresist includes removing solvent from the excess-photoresist/solvent composition, as, for example, by evaporation.

At operation 525, the treated recovered photoresist is filtered to improve quality and rendered acceptable for reuse.

Such recovered photoresist may be acceptable for all uses as the original photoresist, alternatively, such recovered photoresist may be used for less critical applications.

General Matters

Embodiments of the invention provide systems and methods for recovering photoresist for reuse. In accordance with various embodiments of the invention, the photoresist may be recovered through alternative methods and systems. Upon recovery, the photoresist may be treated and filtered to render the photoresist suitable for reuse.

Many alternative system configurations are possible to effect recovery and treatment of the photoresist.

In reference to FIG. 2, a photoresist recovery apparatus is described as having a single photoresist recovery container. Where multiple photoresists are to be recovered, it may be necessary to separately recover each distinct photoresist. That is, where the only difference between two or more photoresists is viscosity that can be adjusted by solvent concentration, then it would be possible to recover the photoresists together. Or, if the only difference between photoresists was that one was dyed and one was not, it may be possible to recover them together and add dye to have a recovered dyed photoresist. However, some photoresists are incompatible and cannot be recovered together. For example, where two or more photoresists, each using a different solvent, are to be recovered, the combination of the photoresists and solvents may be valueless. In such cases, alternative embodiments of the invention employing multiple resist recovery containers for the separate recovery of different photoresists may be used.

For an embodiment employing multiple photoresist recovery containers, the photoresist recovery apparatus may contain multiple perimeter drains, each corresponding to a particular photoresist recovery container. For such an embodiment, the wafer spindle height may be adjusted to align with each perimeter drain to effect the separate recovery of distinct photoresists. In alternative embodiments, the position of the bowl may be adjusted into alternate recovery positions.

For one embodiment, recovery and treatment of the photoresist may be incorporated in an integrated system. For example, as discussed above, after recovery, the photoresist is treated to provide a photoresist with the appropriate amount of solvent. That is, the recovered photoresist may contain more or less solvent than desired depending upon the recovery method employed. Excess solvent added during a particular recovery process may be evaporated, while, for another recovery process, solvent may be added where a deficiency exists due to evaporation during the deposition and recovery processes. The recovered and treated photoresist is then filtered to remove any extraneous particulate matter. In accordance with one embodiment of the invention, system 200 and system 400, described in FIGS. 2 and 4, may include a treating and filtering apparatus. For such an embodiment, the viscosity of the recovered photoresist is monitored as it is recovered to determine the amount of solvent to be added or evaporated. The photoresist is then treated accordingly. The treated, recovered photoresist then proceeds through a filtering mechanism to produce useable photoresist.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A system for photoresist recovery comprising:
    a nozzle to dispense a photoresist;
    a bowl having an interior region and an interior surface;
    a wafer platform disposed within the interior region of the bowl;
    a wafer spindle, coupled to the wafer platform, constructed and arranged to spin the wafer platform to propel an excess amount of photoresist deposited upon a wafer placed upon the wafer platform to the interior surface of the bowl;
    at least one photoresist recovery container coupled to the bowl via a recovery drainpipe;
    a recovery drainpipe block capable of being positioned in front of the recovery drainpipe to prevent contaminates from entering the recovery drainpipe;
    a perimeter drain formed within the bowl by extending around the perimeter of the bowl such that the excess amount of photoresist propelled from the wafer proceeds through the perimeter drain to the photoresist recovery container;
    wherein the perimeter drain comprises:
        a concave conduit for reducing the surface area contacting the photoresist being recovered; and
        a weeping seal to permit a wash solvent to wash the excess amount of photoresist propelled from the wafer through the perimeter drain to the photoresist recovery container.

2. The system of claim 1, wherein the perimeter drain is formed level with a wafer rotation position within the interior surface of the bowl.

3. The system of claim 1, wherein a solvent-rich environment is maintained within the recovery drainpipe.

4. The system of claim 1, further comprising a waste drain formed to communicate with the bowl.

5. The system of claim 1, wherein the wash solvent is the same as or compatible with the solvent used in the photoresist being recovered.

6. The system of claim 1, wherein the perimeter drain is angled so as to facilitate the movement of photoresist to a recovery drain.

7. The system of claim 4, further comprising:
    one or more additional perimeter drains formed within the bowl to recover one or more additional types of photoresists in corresponding photoresist recovery containers.

8. The system of claim 1, further comprising a filtering apparatus to remove particles from the recovered photoresist.

9. The system of claim 1, further comprising a treating apparatus to treat the recovered photoresist to permit its reuse.

10. The system of claim 9, wherein the treating apparatus comprises a viscosity monitoring apparatus used to control the addition or evaporation of solvent, to or from the recovered photoresist.

11. The system of claim 1, wherein the concave conduit has an approximately semicircular toroid shape.

12. A system for photoresist recovery comprising:
    a nozzle to dispense a photoresist;
    a bowl having an interior region and an interior surface;
    a wafer platform disposed within the interior region of the bowl;
    a wafer spindle, coupled to the wafer platform, constructed and arranged to spin the wafer platform to propel an excess amount of photoresist deposited upon a wafer placed upon the wafer platform to the interior surface of the bowl;
    at least one photoresist recovery container coupled to the bowl via a recovery drainpipe;

a recovery drainpipe block capable of being positioned in front of the recovery drainpipe to prevent contaminates from entering the recovery drainpipe;

a perimeter drain formed within the bowl by extending around the perimeter of the bowl such that the excess amount of photoresist propelled from the wafer proceeds through the perimeter drain to the photoresist recovery container;

wherein the perimeter drain comprises a concave conduit for reducing the surface area contacting the photoresist being recovered;

a waste drain formed within the bowl;

one or more additional perimeter drains formed within the bowl to enable the separate recovery of one or more additional types of photoresists, which enables the system to change photoresist types while in production, thus reducing down time for photoresist changing operations; and a weeping seal to permit a wash solvent to wash the excess amount of photoresist propelled from the wafer through one of the perimeter drains to a corresponding photoresist recovery container.

13. The system of claim 12, wherein the spindle is adjustable to alternate spindle heights to accommodate the one or more of the additional perimeter drains.

14. The system of claim 12, wherein the position of the bowl is adjustable relative to the wafer platform.

* * * * *